United States Patent
McCollum

(10) Patent No.: US 10,546,633 B2
(45) Date of Patent: Jan. 28, 2020

(54) RESISTIVE RANDOM ACCESS MEMORY CELL

(71) Applicant: Microsemi SoC Corp., San Jose, CA (US)

(72) Inventor: John L McCollum, Orem, UT (US)

(73) Assignee: Microsemi SoC Corp., San Jose, CA (US)

( * ) Notice: Subject to any disclaimer, the term of this patent is extended or adjusted under 35 U.S.C. 154(b) by 0 days.

(21) Appl. No.: 15/823,323

(22) Filed: Nov. 27, 2017

(65) Prior Publication Data

US 2018/0166135 A1 Jun. 14, 2018

Related U.S. Application Data

(60) Provisional application No. 62/432,047, filed on Dec. 9, 2016.

(51) Int. Cl.
*G11C 13/00* (2006.01)

(52) U.S. Cl.
CPC ...... *G11C 13/0021* (2013.01); *G11C 2213/11* (2013.01); *G11C 2213/15* (2013.01); *G11C 2213/33* (2013.01); *G11C 2213/74* (2013.01); *G11C 2213/77* (2013.01)

(58) Field of Classification Search
CPC ............ G11C 13/0021; G11C 13/0011; G11C 2213/11; G11C 2213/15; G11C 2213/33; G11C 2213/74; G11C 2213/77; H01L 27/2436; H01L 27/2463; H01L 45/085; H01L 45/1233; H01L 45/1266; H01L 45/16
USPC ........................................................ 365/148
See application file for complete search history.

(56) References Cited

U.S. PATENT DOCUMENTS

| | | | |
|---|---|---|---|
| 4,758,745 | A | 7/1988 | Elgamal et al. |
| 4,873,459 | A | 10/1989 | Gamal et al. |
| 4,904,338 | A | 2/1990 | Kozicki |
| 5,229,963 | A | 7/1993 | Ohtsuka et al. |
| 5,254,866 | A | 10/1993 | Ogoh |
| 5,314,772 | A | 5/1994 | Kozicki et al. |
| 5,463,583 | A | 10/1995 | Takashina |
| 5,500,532 | A | 3/1996 | Kozicki |

(Continued)

FOREIGN PATENT DOCUMENTS

WO 2017106523 A1 6/2017

OTHER PUBLICATIONS

Wei Yi et al: Feedback write scheme for memristive switching devices 11, Applied Physics A—Materials Science & Processing, Springer, Berlin, DE, vol. 102, No. 4, Jan. 27, 2011 (Jan. 27, 2011), pp. 973-982.

(Continued)

*Primary Examiner* — Sung Il Cho
(74) *Attorney, Agent, or Firm* — Glass and Associates; Kenneth D'Alessandro; Kenneth Glass

(57) ABSTRACT

A resistive random access memory cell includes three resistive random access memory devices, each resistive random access memory device having an ion source layer and a solid electrolyte layer. The first and second resistive random access memory devices are connected in series such that either both ion source layers or both solid electrolyte layers are adjacent to one another. A third resistive random access memory device is connected in series with the first and second resistive random access memory devices.

19 Claims, 5 Drawing Sheets

(56) References Cited

U.S. PATENT DOCUMENTS

| | | |
|---|---|---|
| 5,537,056 A | 7/1996 | McCollum |
| 5,542,690 A | 8/1996 | Kozicki |
| 5,557,137 A | 9/1996 | Cohen |
| 5,576,568 A | 11/1996 | Kowshik |
| 5,587,603 A | 12/1996 | Kowshik |
| 5,625,211 A | 4/1997 | Kowshik |
| 5,682,389 A | 10/1997 | Nizaka |
| 5,729,162 A | 3/1998 | Rouy |
| 5,761,115 A | 6/1998 | Kozicki et al. |
| 5,770,885 A | 6/1998 | McCollum |
| 5,801,415 A | 9/1998 | Lee et al. |
| 5,812,452 A | 9/1998 | Hoang |
| 5,896,312 A | 4/1999 | Kozicki et al. |
| 5,914,893 A | 6/1999 | Kozicki et al. |
| 5,986,322 A | 11/1999 | McCollum et al. |
| 6,063,663 A | 5/2000 | Caprara et al. |
| 6,084,796 A | 7/2000 | Kozicki et al. |
| 6,100,560 A | 8/2000 | Lovett |
| 6,137,725 A | 10/2000 | Tassan et al. |
| 6,144,580 A | 11/2000 | Murray |
| 6,222,774 B1 | 4/2001 | Tanzawa et al. |
| 6,324,102 B1 | 11/2001 | McCollum |
| 6,326,651 B1 | 12/2001 | Manabe |
| 6,348,365 B1 | 2/2002 | Moore et al. |
| 6,356,478 B1 | 3/2002 | McCollum |
| 6,388,324 B2 | 5/2002 | Kozicki |
| 6,418,049 B1 | 7/2002 | Kozicki et al. |
| 6,437,365 B1 | 8/2002 | Hawley et al. |
| 6,469,364 B1 | 10/2002 | Kozicki |
| 6,487,106 B1 | 11/2002 | Kozicki |
| 6,635,914 B2 | 10/2003 | Kozicki et al. |
| 6,709,887 B2 | 3/2004 | Moore et al. |
| 6,768,687 B2 | 7/2004 | Kaihatsu |
| 6,784,476 B2 | 8/2004 | Kim et al. |
| 6,798,692 B2 | 9/2004 | Kozicki et al. |
| 6,815,784 B2 | 11/2004 | Park et al. |
| 6,825,489 B2 | 11/2004 | Kozicki |
| 6,847,073 B2 | 1/2005 | Kanaya |
| 6,849,891 B1 | 2/2005 | Hsu et al. |
| 6,864,500 B2 | 3/2005 | Gilton |
| 6,865,117 B2 | 3/2005 | Kozicki |
| 6,891,769 B2 | 5/2005 | McCollum et al. |
| 6,914,802 B2 | 7/2005 | Kozicki |
| 6,927,411 B2 | 8/2005 | Kozicki |
| 6,940,745 B2 | 9/2005 | Kozicki |
| 6,955,940 B2 | 10/2005 | Campbell et al. |
| 6,970,383 B1 | 11/2005 | Han et al. |
| 6,978,374 B1 | 12/2005 | Hansen et al. |
| 6,985,378 B2 | 1/2006 | Kozicki |
| 6,998,312 B2 | 2/2006 | Kozicki et al. |
| 7,006,376 B2 | 2/2006 | Kozicki |
| 7,061,036 B2 | 6/2006 | Kajiyama |
| 7,078,295 B2 | 7/2006 | Jeon et al. |
| 7,101,728 B2 | 9/2006 | Kozicki et al. |
| 7,120,053 B2 | 10/2006 | Atsumi et al. |
| 7,120,079 B2 | 10/2006 | McCollum et al. |
| 7,126,837 B1 | 10/2006 | Banachowicz et al. |
| 7,142,450 B2 | 11/2006 | Kozicki et al. |
| 7,145,794 B2 | 12/2006 | Kozicki |
| 7,169,635 B2 | 1/2007 | Kozicki |
| 7,180,104 B2 | 2/2007 | Kozicki |
| 7,187,610 B1 | 3/2007 | McCollum et al. |
| 7,227,169 B2 | 6/2007 | Kozicki |
| 7,232,717 B1 | 6/2007 | Choi et al. |
| 7,245,535 B2 | 7/2007 | McCollum et al. |
| 7,288,781 B2 | 10/2007 | Kozicki |
| 7,294,875 B2 | 11/2007 | Kozicki |
| 7,301,821 B1 | 11/2007 | Greene et al. |
| 7,339,232 B2 | 3/2008 | Seo et al. |
| 7,368,789 B1 | 5/2008 | Dhaoui et al. |
| 7,372,065 B2 | 5/2008 | Kozicki et al. |
| 7,385,219 B2 | 6/2008 | Kozicki et al. |
| 7,402,847 B2 | 7/2008 | Kozicki et al. |
| 7,405,967 B2 | 7/2008 | Kozicki et al. |
| 7,430,137 B2 | 9/2008 | Greene et al. |
| 7,499,360 B2 | 3/2009 | McCollum et al. |
| 7,511,532 B2 | 3/2009 | Derharcobian et al. |
| 7,519,000 B2 | 4/2009 | Caveney et al. |
| 7,560,722 B2 | 7/2009 | Kozicki |
| 7,675,766 B2 | 3/2010 | Kozicki |
| 7,692,972 B1 | 4/2010 | Sadd et al. |
| 7,728,322 B2 | 6/2010 | Kozicki |
| 7,763,158 B2 | 7/2010 | Kozicki |
| 7,816,717 B2 | 10/2010 | Ozaki |
| 7,839,681 B2 | 11/2010 | Wang et al. |
| 7,928,492 B2 | 4/2011 | Jeon et al. |
| 7,929,345 B2 | 4/2011 | Issaq |
| 8,269,203 B2 | 9/2012 | Greene et al. |
| 8,269,204 B2 | 9/2012 | Greene et al. |
| 8,415,650 B2 | 4/2013 | Greene et al. |
| 8,531,866 B2 | 9/2013 | Ikegami et al. |
| 8,598,560 B1 * | 12/2013 | Milojevic ............... H01L 45/085 257/1 |
| 8,735,211 B2 | 5/2014 | Greeley et al. |
| 9,128,821 B2 | 9/2015 | Chen et al. |
| 9,646,692 B1 | 5/2017 | Lung et al. |
| 9,704,573 B1 | 7/2017 | Hecht |
| 9,959,927 B2 | 5/2018 | Zhou et al. |
| 2002/0003247 A1 | 1/2002 | Yokoyama et al. |
| 2003/0107105 A1 | 6/2003 | Kozicki |
| 2003/0222303 A1 | 12/2003 | Fukuda |
| 2004/0124407 A1 | 7/2004 | Kozicki et al. |
| 2005/0141431 A1 | 6/2005 | Caveney et al. |
| 2005/0201143 A1 * | 9/2005 | Pinnow ............... H01L 27/2436 365/149 |
| 2005/0225413 A1 | 10/2005 | Kozicki et al. |
| 2006/0028895 A1 | 2/2006 | Taussig et al. |
| 2006/0050546 A1 * | 3/2006 | Roehr ................... B82Y 10/00 365/148 |
| 2006/0051927 A1 | 3/2006 | Takami |
| 2006/0086989 A1 | 4/2006 | Lee et al. |
| 2006/0171200 A1 | 8/2006 | Rinerson et al. |
| 2006/0230375 A1 | 10/2006 | Casey et al. |
| 2006/0238185 A1 | 10/2006 | Kozicki |
| 2006/0291364 A1 | 12/2006 | Kozicki |
| 2007/0045728 A1 | 3/2007 | Lee |
| 2007/0075352 A1 | 4/2007 | Irie |
| 2007/0108508 A1 | 5/2007 | Lin et al. |
| 2007/0109861 A1 | 5/2007 | Wang et al. |
| 2007/0121369 A1 | 5/2007 | Happ |
| 2007/0146012 A1 | 6/2007 | Murphy |
| 2007/0165446 A1 | 7/2007 | Oliva et al. |
| 2007/0165532 A1 | 7/2007 | Retana et al. |
| 2007/0176264 A1 * | 8/2007 | Lee ...................... H01L 45/04 257/614 |
| 2008/0101117 A1 | 5/2008 | Ogura et al. |
| 2008/0113560 A1 | 5/2008 | Caveney et al. |
| 2008/0211540 A1 | 9/2008 | Fujita |
| 2008/0279028 A1 | 11/2008 | McCollum et al. |
| 2009/0034325 A1 | 2/2009 | Lowrey et al. |
| 2009/0184359 A1 | 7/2009 | He et al. |
| 2009/0198812 A1 | 8/2009 | Caveney et al. |
| 2009/0283740 A1 | 11/2009 | Kozicki et al. |
| 2010/0092656 A1 | 4/2010 | Kozicki |
| 2010/0100857 A1 | 4/2010 | Chen et al. |
| 2010/0135071 A1 | 6/2010 | Kozicki |
| 2010/0149873 A1 | 6/2010 | Wang et al. |
| 2010/0157688 A1 | 6/2010 | Issaq |
| 2010/0169886 A1 | 7/2010 | Troxel et al. |
| 2010/0208520 A1 | 8/2010 | Wang et al. |
| 2011/0001108 A1 * | 1/2011 | Greene ............... H01L 27/2436 257/2 |
| 2011/0001115 A1 | 1/2011 | Greene et al. |
| 2011/0001116 A1 * | 1/2011 | Greene ............... H01L 27/2436 257/4 |
| 2011/0002167 A1 | 1/2011 | McCollum |
| 2011/0024821 A1 | 2/2011 | Wang et al. |
| 2011/0205780 A1 | 8/2011 | Yasuda et al. |
| 2012/0223381 A1 | 9/2012 | Lu et al. |
| 2013/0033921 A1 | 2/2013 | Tsuda et al. |
| 2013/0134378 A1 | 5/2013 | Liu |
| 2013/0175494 A1 * | 7/2013 | Collins ................ H01L 45/085 257/4 |
| 2013/0234100 A1 | 9/2013 | An et al. |

(56) References Cited

U.S. PATENT DOCUMENTS

| | | | |
|---|---|---|---|
| 2013/0242640 A1* | 9/2013 | Haukness | G11C 13/0069 365/148 |
| 2013/0248797 A1* | 9/2013 | Sandhu | H01L 45/04 257/2 |
| 2013/0301337 A1 | 11/2013 | Kamalanathan et al. | |
| 2014/0071745 A1 | 3/2014 | Kawasumi | |
| 2014/0151621 A1 | 6/2014 | Tendulkar | |
| 2014/0158968 A1 | 6/2014 | Jo | |
| 2014/0175531 A1 | 6/2014 | Huang et al. | |
| 2014/0233301 A1 | 8/2014 | Lu et al. | |
| 2014/0246719 A1 | 9/2014 | Dhaoui | |
| 2014/0264238 A1 | 9/2014 | Jo | |
| 2014/0269008 A1 | 9/2014 | Baker, Jr. | |
| 2015/0029775 A1* | 1/2015 | Ravasio | H01L 45/1666 365/63 |
| 2015/0188039 A1 | 2/2015 | Wang | |
| 2015/0076439 A1 | 3/2015 | Saitoh et al. | |
| 2015/0171323 A1 | 6/2015 | Hashim et al. | |
| 2015/0206582 A1 | 7/2015 | Lam et al. | |
| 2016/0225443 A1 | 8/2016 | Chou et al. | |
| 2016/0240251 A1 | 8/2016 | Shih et al. | |
| 2016/0133837 A1 | 12/2016 | Hsueh | |
| 2017/0345496 A1 | 11/2017 | Liu et al. | |

OTHER PUBLICATIONS

Yi-Chung Chen et al: "The 3-D Stacking Bipolar RRAM for High Density", IEEE Transactions on Nanotechnology, IEEE Service Center, Piscataway, NJ, US, vol. 11, No. 5, Sep. 1, 2012 (Sep. 1, 2012), pp. 948-956.

International Search Report and Written Opinion of the International Searching Authority dated Dec. 19, 2017, International application No. PCT/US2017/054174.

Lian, et al., "Improved Resistive Switching Uniformity in Cu/HfO2/Pt Devices by Using Current Sweeping Mode", IEEE Electron Device Letters, vol. 32, No. 8, Aug. 2011.

Moriyama, et al., "Pulse Switching Property of Reset Process in Resistive Random Access Memory (ReRAM) Consisting of Binary-Transition-Metal-Oxides", The Electrochemical Society, Abstract #2830, Honolulu PRiME 2012.

Wang, et al., "Impact of program/erase operation on the performances of oxide-based resistive switching memory", Nanoscale Research Letters (2015) 10:39, Feb. 5, 2015.

Yang, "A 2Mb ReRAM with two bits error correction codes circuit for high reliability application", IEEE, 2013.

PCT/US2016/066955, Notification of Transmittal of The International Search Report and The Written Opinion of the International Searching Authority, or the Declaration, Form PCT/ISA/220.

PCT/US2016/066967, Notification of Transmittal of The International Search Report and The Written Opinion of the International Searching Authority, or the Declaration, Form PCT/ISA/220.

Aratani, et al., Aratani, K. "A Novel Resistance Memory with High Scalability and Nanosecond Switching," IEDM, 2007, pp. 783-786.

Baek, et al., Baek, I. G. et al., "Highly Scalable Non-volatile Resistive Memory using Simple Binary Oxide Driven by Asymmetric Uni-polar Voltage Pulses, Samsung Advanced Institute of Technology," IDEM 2004, 26 pages.

Burr, Burr, G. W. et al., "Overview of Candidate Device Technologies for Storage-class Memory," IBM Journal of Research & Development, 2008, vol. 52, No. 4/5, pp. 449-464.

Choi, et al., Choi, S. J. et al., "Improvement of CBRAM Resistance Window by Scaling Down Electrode Size in Pure-GeTe Film," IEEE Electron Device Letters, Feb. 2009, vol. 30, No. 2, pp. 120-122.

Fang, et al., Fang, T. N. et al, "Erase Mechanism for Copper Oxide Resistive Switching Memory Cells with Nickel Electrode," Int'l Electron Devices Meeting, 2006, pp. 1-4.

Greene, et al., Greene, Jonathan et al., "Antifuse Field Programmable Gate Arrays," Proceedings of the IEEE, Jul. 1993, vol. 81, No. 7, pp. 1042-1056.

Kund, et al., Kund, Michael et al., "Conductive Bridging RAM (CBRAM): An Emerging Non-volatile Memory Technology Scalable to Sub 20nm," IEDM Technical Digest, Dec. 5, 2005, pp. 754-757, held in Washington, D.C.

Lemieux, et al., Lemieux, G. et al., "Directional and Single-Driver Wires in FPGA Interconnect," International Conference on Field-Programmable Technology (ICFPT), Dec. 2004, pp. 41-48, Brisbane, Australia.

Meyer, Meyer, R., "Scalable Non-volatile Cross-point Memory Based on Dual-layer Oxide Memory Elements," 9th Annual Non-volatile Memory Technology Symposium, Nov. 11-14, 2008, in Pacific Grove, CA, Unity Semiconductor Corporation, Sunnyvale, CA 94085, 41 pp.

Meyer, et al., Meyer, R. et al., "Oxide Dual-layer Memory Element for Scalable Non-volatile Cross-point Memory Technology," 9th Annual Non-volatile Memory Technology Symposium, Nov. 11-14, 2008, in Pacific Grove, CA, pp. 1-5.

Sakamoto, et al., Sakamoto, T. et al., "A /Ta2O5 Solid-Electrolyte Switch with Improved Reliabiltiy," 2007 IEEE Symposium on VLSI Technogy, Jun. 12-14, 2007, pp. 38-39, held in Kyoto, JP.

Strukov, et al., Strukov, Dimitri B. et al., "The Missing Memristor Found," Nature, May 1, 2008, vol. 453, pp. 80-85.

Symanczyk, Symanczyk, Ralf, "Conductive Bridging Memory Devleopment from Single Cells to 2Mbit Memory Arrays," 8th Non-Volatile Memory Technology Symposium, Nov. 10-13, 2007, 25 pages.

PCT/US2017/062878 International Search Report and Written Opinion, dated Mar. 28, 2018.

\* cited by examiner

RESISTIVE RANDOM ACCESS MEMORY CELL

CROSS-REFERENCE TO RELATED APPLICATION

This patent application claims the benefit of U.S. Provisional Patent Application No. 62/432,047, entitled "Resistive Random Access Memory Cell," filed Dec. 9, 2016, which applications are incorporated in their entirety here by this reference.

BACKGROUND

The present invention relates to field programmable gate array (FPGA) technology. More particularly, the present invention relates to programmable elements for use in FPGA devices, and specifically to programmable elements configured from resistive random access memories (ReRAMs) formed from individual ReRAM devices.

FPGA integrated circuits are versatile, but are large therefore are cost sensitive and consume considerable amounts of power. Making them area efficient has been a major goal.

ReRAMs have been proposed for fabricating multiplexers in FPGA devices. A ReRAM device is a two-terminal device including an ion source layer and a solid electrolyte layer. To program a ReRAM device a voltage potential placed across the two terminals of the device causes metal ions from the ion source layer to migrate into the solid electrolyte layer to form a conductive path across the entire device. The ReRAM device is erased by applying a voltage potential across the two terminals of the device opposite in polarity to the potential that was used to program the device. This causes the metal ions to migrate back into the ion source layer from the solid electrolyte layer to eliminate the conductive path across the entire device. Most proposals suggest using a pair of ReRAM devices in back-to-back orientation (in which either the ion source layers or the solid electrolyte layers of the two ReRAM devices are connected together) so that one device is always in the reverse bias condition to avoid disturb (unintentional programming of the ReRAM memory device to its on state) during logic switching.

FIG. 1A is a schematic diagram of a prior-art ReRAM memory cell 10 formed from a pair of ReRAM devices 12 and 14 arranged in a back-to-back configuration. The terminal of each of ReRAM devices 12 and 14 having the angled end is the ion-source terminal of the device. A programming transistor 16 has its drain coupled to the common node 18 of the ion-source ends of the ReRAM devices 12 and 14. The source of programming transistor 16 is coupled to a Y-decode line 20 and its gate is coupled to an X-decode line 22.

During normal circuit operation, a first end 24 of the memory cell 10 is connected to a first circuit node of the circuit in which the memory cell 10 is used and a second end 26 of the memory cell 10 is connected to a second circuit node of the circuit in which the memory cell 10 is used. When the ReRAM devices 12 and 14 are erased, the first node 24 remains unconnected to the second node 26 and when the ReRAM devices 12 and 14 are programmed, the first node 24 is connected to the second node 26 through the memory cell 10. As will be appreciated by persons of ordinary skill in the art, the first node 24 and the second node 26 may be any nodes in the integrated circuit that the ReRAM cell 10 will programmably connect to one another. Non-limiting examples include inputs and outputs of clocked or static logic function circuits, or interconnect conductors in a circuit routing architecture of an integrated circuit that has user-programmable connections.

To program memory cell 10, the ReRAM devices are individually programmed. A first programming potential is placed on Y-decode line 20, a second programming potential is placed on first and second ends 24 and 26 of the ReRAM cell 10, and programming transistor 16 is turned on by applying an appropriate voltage to its gate from X-decode line 20. To erase memory cell 10, the ReRAM devices are individually erased. A first erase potential is placed on Y-decode line 20, a second erase potential is placed on first and second ends 24 and 26 of the ReRAM cell 10, and programming transistor 16 is turned on by applying an appropriate voltage to its gate from X-decode line 20. ReRAM cells 12 and 14 can be programmed and erased either simultaneously, as described above, or individually by controlling the voltage potentials delivered to first and second ends 24 and 26 of ReRAM cell 10 and to X-decode line 22 and Y-decode line 20. The design of circuits for supplying such program and erase voltages at appropriate voltage levels, polarities, and timings for resistive random access memory devices formed using particular materials and having specific geometries are well within the level of ordinary skill in the art.

FIG. 1B is a cross-sectional diagram of an illustrative embodiment of an implementation of the memory cell 10 of FIG. 1A. The semiconductor substrate, or well, 30 includes diffused regions 32 and 34 that serve as the drain and source, respectively, of transistor 16 of FIG. 1. The source 34 is connected to the Y-decode line 20 of FIG. 1. Polysilicon line 36 forms the gate of transistor 16 of FIG. 1A and can also serve as the X-decode line 22 (shown in FIG. 1) for programming the memory cell 10.

A contact 38 connects the drain region 32 of the transistor 16 to a segment 40 of a first metal interconnect line over which the ReRAM devices 12 and 14 of FIG. 1A will be formed. A contact 42 connects the segment 40 of the first metal interconnect line to the solid electrolyte layer 44 of ReRAM device 12 (shown in dashed lines in FIG. 1B). The ion source 46 of the first ReRAM device 12 is connected by contact 48 to segment 50 of a second metal interconnect line. Similarly, a contact 52 connects the segment 40 of the first metal interconnect line to the solid electrolyte layer 54 of ReRAM device 14 (shown in dashed lines in FIG. 1B). The ion source 56 of the first ReRAM device 14 is connected by contact 58 to segment 60 of the second metal interconnect line. Persons of ordinary skill in the art will appreciate that the designations of first and second metal interconnect lines are used for convenience.

Referring now to FIG. 2, a typical top view of a prior-art pair of 4:1 multiplexers 70 using prior-art ReRAM cells as described above is shown. Segments 72, 74, 76, and 78 of a second metal interconnect line form Input 1, Input 2, Input 3, and Input 4 of the multiplexers. Segments 80 and 82 of the second metal interconnect line form Output 1 and Output 2 of the multiplexers. Segments 84, 86, 88, and 90 of a first metal interconnect line form the first metal line segment 40 for each of the ReRAM cells depicted in FIG. 1B used to connect Input 1, Input 2, Input 3, and Input 4 of the multiplexers to Output 1 of the first multiplexer and segments 92, 94, 96, and 98 of the first metal interconnect line form the first metal line segment 40 for each of the ReRAM cells depicted in FIG. 1B used to connect Input 1, Input 2, Input 3, and Input 4 of the multiplexers to Output 2 of the second multiplexer.

The small squares in dashed lines represent the ReRAM devices 12 and 14 for each ReRAM cell used in the multiplexers 70 of FIG. 2. To connect an input to an output, both ReRAM devices 12 and 14 in the selected multiplexer input/output pair must be programmed to make connections. For the first multiplexer, ReRAM devices 12-1-1 and 14-1-1 are programmed to connect Input 1 to Output 1; ReRAM devices 12-1-2 and 14-1-2 are programmed to connect Input 2 to Output 1; ReRAM devices 12-1-3 and 14-1-3 are programmed to connect Input 3 to Output 1; and ReRAM devices 12-1-4 and 14-1-4 are programmed to connect Input 4 to Output 1. For the second multiplexer, ReRAM devices 12-2-1 and 14-2-1 are programmed to connect Input 1 to Output 2; ReRAM devices 12-2-2 and 14-2-2 are programmed to connect Input 2 to Output 2; ReRAM devices 12-2-3 and 14-2-3 are programmed to connect Input 3 to Output 2; and ReRAM devices 12-2-4 and 14-2-4 are programmed to connect Input 4 to Output 2. Bitlines 22a and 22b are used to turn on the programming transistors (not shown) to program the ReRAM cells for the first and second multiplexers, respectively.

A major issue that arises when using ReRAM memory cells formed from pairs of ReRAM devices in back-to-back orientation is the possible failure of a memory cell due to one of the ReRAM devices either becoming short circuited or losing its ability to be switched off once it is programmed. With one of the devices stuck in the on state, the probability that disturb is likely to eventually cause an erased ReRAM memory cell, in which both ReRAM devices are supposed to be switched to their erased state, to fail by disturbing the working erased ReRAM device to its programmed state during normal use of the FPGA device creates a significant endurance issue for integrated circuits incorporating these memory cells, particularly in circuits such as, but not limited to, multiplexers and look-up tables (LUTs) where unpredictable logic level voltages will appear at one end of ReRAM cells disposed in unselected circuit paths.

In the exemplary prior-art multiplexer circuit shown in FIG. 2, assume Input 1 is programmably connected to Output 1 by programming the ReRAM memory cell formed by ReRAM devices 14-1-1 and 12-1-1, and further that Input 1 carries a ground potential associated with a logic 0 state. If it is further assumed that Input 2 is connected to a circuit node the carries a $V_{DD}$ potential representing a logic 1 state, a potential device disturb problem will arise if either ReRAM device 14-1-2 or 12-1-2 shorts or fails to erase because then the entire logic potential of $V_{DD}$ will exist across the erased one of ReRAM devices 14-1-2 or 12-1-2.

BRIEF DESCRIPTION

In accordance with the present invention, a third ReRAM device is connected in series with two back-to-back ReRAM devices. This third device becomes a redundant element in case one of the three devices fails to erase (become open circuited). The remaining two functioning ReRAM devices are still able to provide the function. The orientation of the third device is not important because the logic voltage is so low (~0.8V) that dividing it across any two ReRAM devices reduces the stress on each of the devices to 0.4V, a value below which the stress threatens the integrity of the programmed device.

According to one aspect of the present invention, a resistive random access memory cell includes three resistive random access memory devices, each resistive random access memory device having an ion source layer and a solid electrolyte layer. The first and second resistive random access memory devices are connected in series such that either both ion source layers or both solid electrolyte layers are adjacent to one another. A third resistive random access memory device is connected in series with the first and second resistive random access memory devices.

According to another aspect of the present invention, the ReRAM cell of the present invention is connected between a first circuit node and a second circuit node and may be used to programmably connect the first circuit node to the second circuit node.

According to other aspects of the present invention, methods are disclosed for forming integrated circuit including the resistive random access memory devices of the present invention.

Employing a ReRAM cell formed from three ReRAM devices connected in series to configure programmable circuits is a significant advantage of the present invention because it is a good solution to the endurance issue raised by the disturb phenomenon to which ReRAM memory cells configured from a pair of back-to-back ReRAM devices are susceptible and still represents a major improvement in density over prior solutions employing other programmable device technologies.

BRIEF DESCRIPTION OF THE DRAWING FIGURES

The invention will be explained in more detail in the following with reference to embodiments and to the drawing in which are shown:

DETAILED DESCRIPTION

Persons of ordinary skill in the art will realize that the following description of the present invention is illustrative only and not in any way limiting. Other embodiments of the invention will readily suggest themselves to such skilled persons.

Figure 3A:
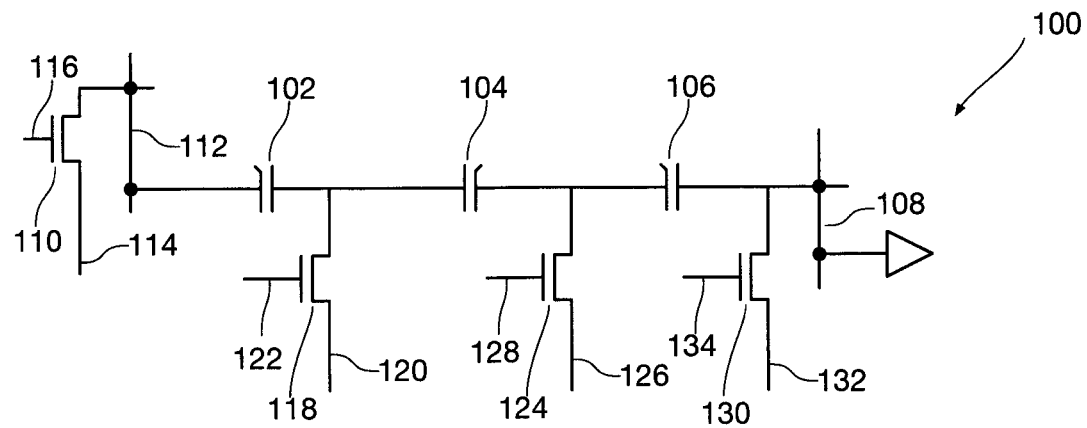
FIG. 3A is a schematic diagram of an illustrative ReRAM memory cell in accordance with one aspect of the present invention.
Figure 3B:
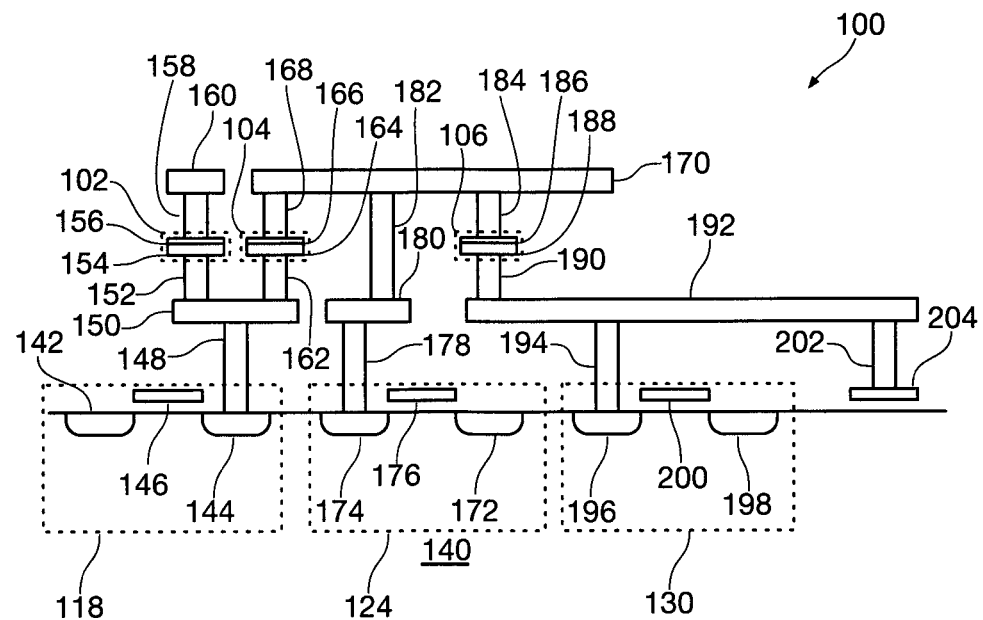
FIG. 3B is a cross-sectional diagram of an illustrative embodiment of an implementation of the memory cell of FIG. 1A.

Referring first of all to FIG. 3A and FIG. 3B, ReRAM cell 100 includes ReRAM devices 102 and 104 connected together in series in a back-to-back configuration with their ion-source ends connected together. A third ReRAM device 106 is connected in series with the combination of ReRAM devices 102 and 104. The particular embodiment shown in FIG. 3A has the solid electrolyte end of the ReRAM device 102 in contact with the solid electrolyte end of ReRAM device 104, and the ion source of ReRam device 104 is connected to the ion source end of third ReRAM device 106, but the orientation of the third ReRAM device 106 is not important because the logic voltage at which the circuit will operate during normal use is so low (~0.8V) that, in the event of failure of one of the ReRAM devices, dividing the logic voltage across any two of the remaining functional ReRAM devices 102, 104, and 106 reduces the voltage stress to 0.4V across any one of the devices.

The series string of ReRAM devices 102, 104, and 106 is connected to a conductor 108. Conductor 108 may be any circuit node in an integrated circuit that can be programmably connected to another circuit node in the integrated circuit. In the non-limiting example of FIG. 3A, conductor 108 is shown being associated with the input of a buffer associated with another device on the integrated circuit such as a multiplexer or other circuit, but persons of ordinary skill in the art will appreciate that conductor 108 can be any conductor in the integrated circuit to which it is desired to make a programmable connection using the ReRAM cell of the present invention. Non-limiting examples include inputs and outputs of programmable or hardwired clocked or static logic function circuits, inputs and outputs of hardwired dedicated function circuits in the integrated circuit, or interconnect conductors in a circuit routing architecture of an integrated circuit that employs user-programmable connections between programmable or hardwired circuits on the integrated circuit.

A first programming transistor 110 has its drain connected to conductor 112, which represents any conductor, such as a programmable routing resource or the output node of some circuit element in the FPGA or other integrated circuit that will be connected to the circuit node represented by conductor 108 using the ReRAM cell 100. The ion source end of ReRAM device 102 is connected to the conductor 112. The source of the first programming transistor 110 is connected to a programming voltage node 114, and its gate is connected to a word line 116.

A second programming transistor 118 has its drain connected to the common solid electrolyte ends of ReRAM devices 102 and 104, its source connected to a programming voltage at bit line node 120, and its gate connected to a word line 122. A third programming transistor 124 has its drain connected to the ion source end of ReRAM device 104 and to the ion source end of ReRAM device 106, its source connected to a programming voltage bit line node 126, and its gate connected to a word line 128. A fourth programming transistor 130 has its drain connected to the common connection between the solid electrolyte end of ReRAM device 106 and the gate of the input buffer 108, its source connected to a programming voltage at bit line node 132, and its gate connected to a word line 134. Word lines 122, 128, and 134 may be connected in common with one another and configured from, for example, a single strip of polysilicon gate material.

Figure 1A:
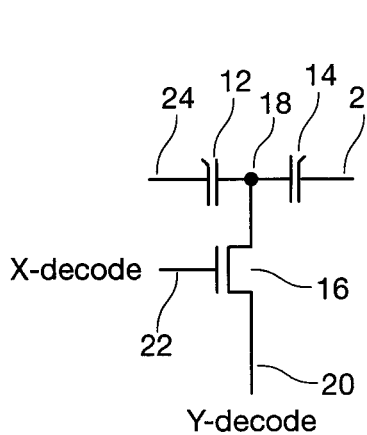
FIG. 1A is a schematic diagram of a prior-art ReRAM memory cell formed from a pair of ReRAM devices arranged in a back-to-back configuration.
Figure 1B:
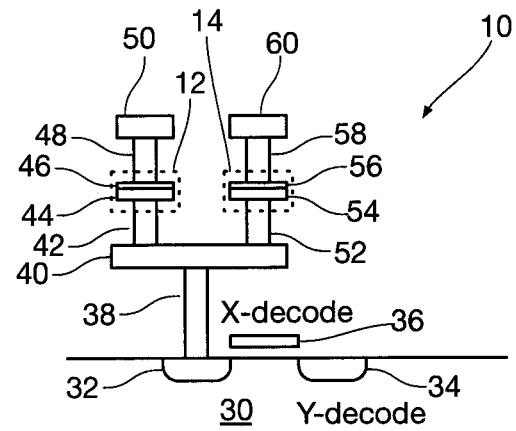
FIG. 1B is a cross-sectional diagram of an illustrative embodiment of an implementation of the memory cell of FIG. 1A.
Figure 2:
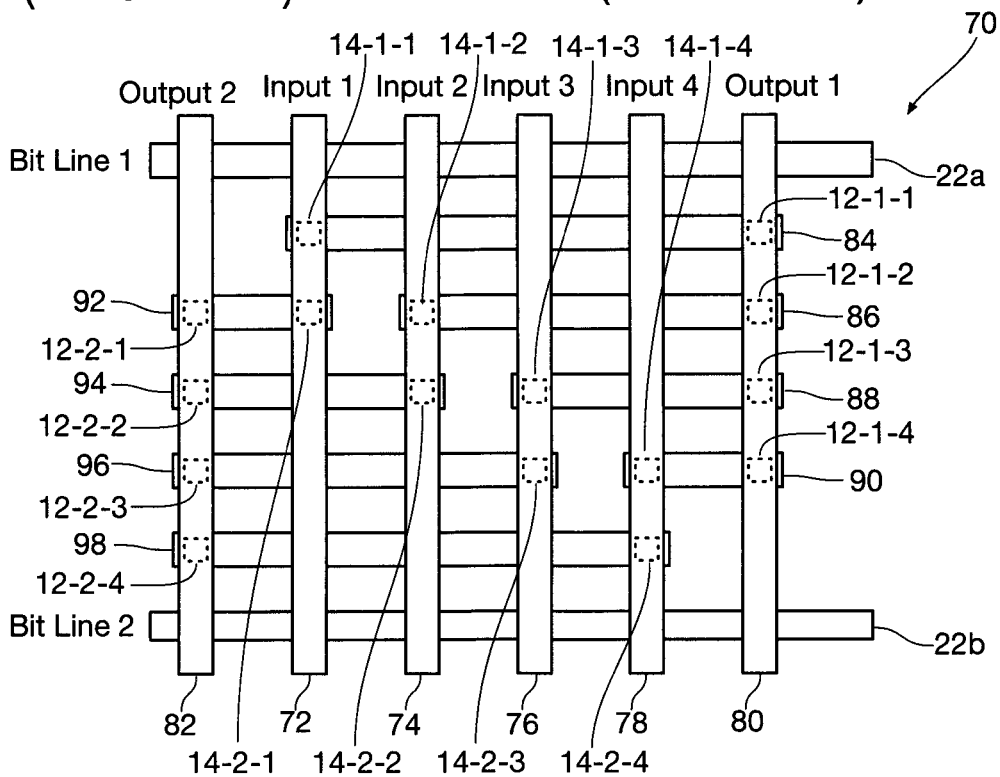
FIG. 2 is a typical top view of a prior-art pair of 4:1 multiplexers using prior-art ReRAM cells.

Referring now to FIG. 3B, a cross-sectional diagram shows an illustrative embodiment of an implementation of the memory cell 100 of FIG. 2A. The semiconductor substrate, or well, 140 includes diffused regions 142 and 144 that serve as the source and drain, respectively, of second programming transistor 118 of FIG. 3A (shown in FIG. 3B within dashed lines 118). Polysilicon line 146 forms the gate of transistor 118 of FIG. 3A and can also serve as a common bit line as mentioned above for programming the memory cell 100. The source 142 is connected to the bit line 120 of FIG. 3A.

A contact 148 connects the drain region 144 of the transistor 118 to a segment 150 of a first metal interconnect line over which the ReRAM devices 102 and 104 of FIG. 3A will be formed. A contact 152 connects the segment 150 of the first metal interconnect line to the solid electrolyte layer 154 of ReRAM device 102 (shown within dashed lines 102 of FIG. 3B). The ion source layer 156 of the first ReRAM device 102 is connected by contact 158 to segment 160 of a second metal interconnect line. Similarly, a contact 162 connects the segment 150 of the first metal interconnect line to the solid electrolyte layer 164 of the second ReRAM device 104. The ion source layer 166 of the second ReRAM device 104 is connected by contact 168 to segment 170 of the second metal interconnect line. Persons of ordinary skill in the art will appreciate that the designations first and second metal interconnect lines are used for convenience.

Diffused regions 172 and 174 serve as the source and drain, respectively, of transistor 124 of FIG. 3A (shown in FIG. 3B within dashed lines 124). Polysilicon line 176 forms the gate of transistor 124 of FIG. 3A and can also serve as a common bit line as mentioned above for programming the memory cell 100. The source 172 of third programming transistor 124 is connected to the bit line 126 of FIG. 3A.

The drain 174 of third programming transistor 124 is connected by contact 178 to segment 180 of the first metal interconnect line. Contact 182 connects the segment 180 of the first metal interconnect line to segment 170 of the second metal interconnect line. Contact 184 connects segment 170 of the second metal interconnect line to the ion source layer 186 of third ReRAM device 106. The solid electrolyte layer 188 of ReRAM device 106 is connected by contact 190 to segment 192 of the first metal interconnect layer. Contact 194 connects segment 192 of the first metal interconnect layer to diffused region 196 which acts as the drain of fourth programming transistor 130. The source 198 of fourth programming transistor 130 is connected to the bit line 132 of FIG. 3A. Polysilicon line 200 forms the gate of transistor 130 of FIG. 3A and can also serve as a common bit line 134 as mentioned above for programming the memory cell 100.

In the particular embodiment shown in FIG. 3B, segment 192 of the first metal interconnect layer (representing conductor 108 in FIG. 3A) is connected by contact 202 to gate 204 which is associated with a device such as buffer as is shown in the non-limiting example of FIG. 3A.

First programming transistor 110 of FIG. 3A is not shown in the cross-sectional diagram of FIG. 3B but persons of ordinary skill in the art will appreciate that segment 160 of second metal interconnect layer can serve as the conductor 112 in FIG. 3A, which represents the output node of a circuit element in the FPGA that will be connected to another circuit node using the ReRAM cell 100.

Methods for fabricating the ReRAM cells of the present invention are readily apparent to integrated circuit designers from an examination of FIG. 3B. Basically, a method for forming a programmable connection in an integrated circuit involves forming a first metal interconnect layer having at least first and second segments electrically insulated from one another, forming first and second resistive random access memory devices over and in electrical contact with the first segment of the first metal interconnect layer, each of the first and second resistive random access memory devices having an ion source layer and a solid electrolyte layer such that both ion source layers are adjacent to the first segment of the first metal interconnect layer, forming a third resistive random access memory device having an ion source layer and a solid electrolyte layer over and in electrical contact with the second segment of the first metal interconnect layer such that the ion source layer is adjacent to the second segment of the first metal interconnect layer, forming a second metal interconnect layer over the first and second resistive random access memory devices, the second metal interconnect layer having at least first and second segments electrically insulated from one another, the first segment of the second metal interconnect layer in electrical contact with the first resistive random access memory device such that the solid electrolyte layer of the first resistive random access memory device is adjacent to the first segment of the second metal interconnect layer, the second segment of the second metal interconnect layer in electrical contact with the second and third resistive random access memory device such that the solid electrolyte layers of the second and third resistive random access memory devices are adjacent to the second segment of the second metal interconnect layer. In alternate embodiments, the positions of the ion source layers and solid electrolyte layers of the individual ReRAM devices can be reversed as taught herein.

Initially, all of the ReRAM devices 102, 104 and 106 in ReRAM memory cell 100 will be in an erased (i.e., non-conducting) state. ReRAM devices 104 and 106 are preferably programmed first. ReRAM device 104 is programmed by applying a programming potential (e.g., about 4V) between bit lines 120 and 126 and turning on second and third programming transistors 118 and 124 by applying appropriate voltages to the word lines 122 and 128. Similarly, ReRAM device 106 is programmed by applying a programming potential (e.g., about 4V) between bit lines 126 and 132 and turning on third and fourth programming transistors 124 and 130 by applying appropriate voltages to the word lines 128 and 134. ReRAM device 102 may be programmed by applying a programming potential between bit lines 114 and 120 and applying it to ReRAM device 102 by turning on first and second programming transistors 110 and 118 by applying appropriate voltages to the word lines 116 and 122. Erasing of the ReRAM devices 102, 104, and 106 is performed in the same manner as programming of these devices, except that the polarities of the programming potentials are reversed. The design of circuits for supplying such program and erase voltages at appropriate voltage levels, polarities, and timings for resistive random access memory devices formed using particular materials and having specific geometries are well within the level of ordinary skill in the art.

Figure 4:
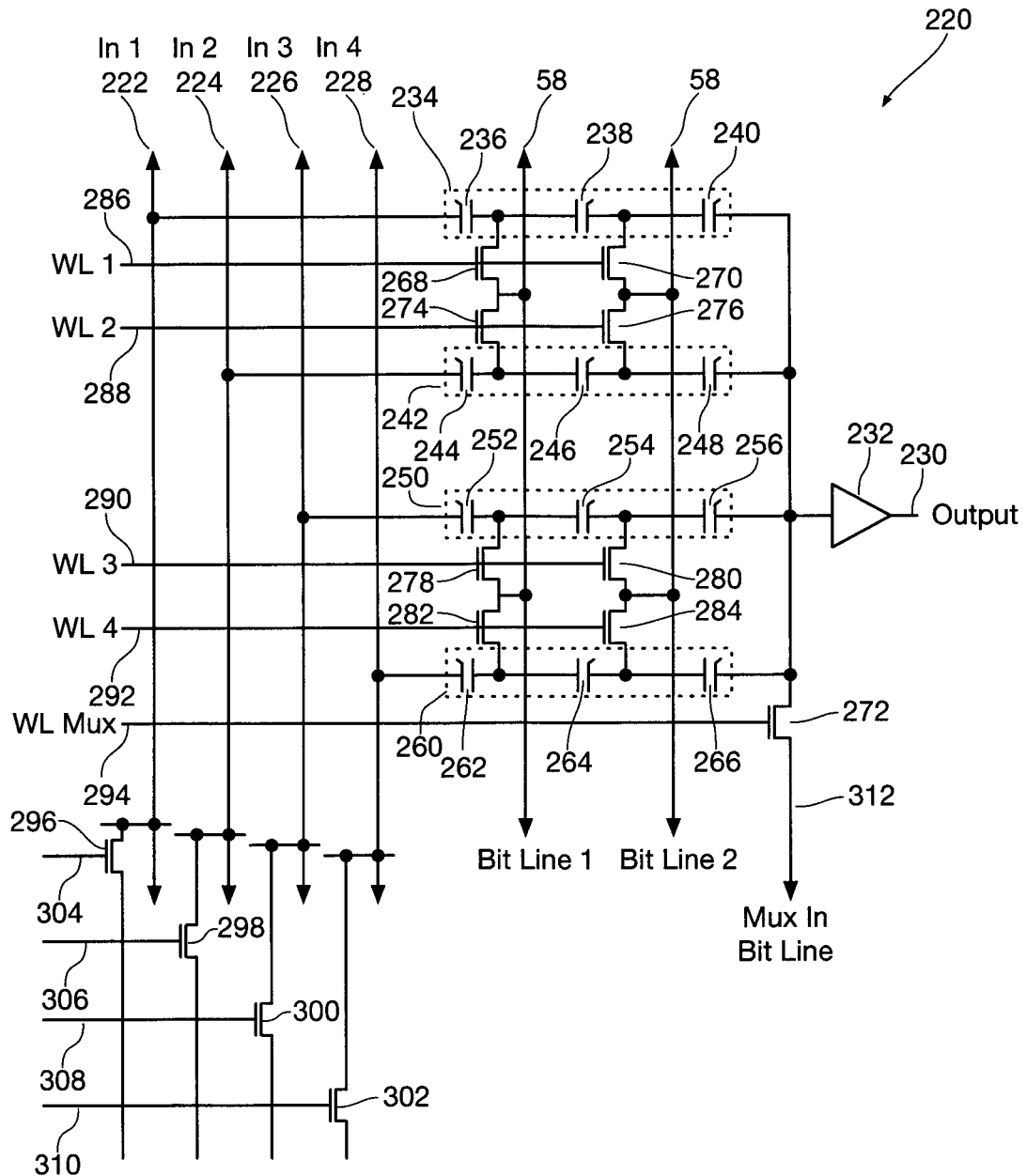
FIG. 4 is a schematic diagram illustrating an exemplary scheme for programming the ReRAM devices in a multiplexer configured from ReRAM memory cells in accordance with the present invention.

Referring now to FIG. 4, a schematic diagram illustrates a circuit 220 that represents one exemplary scheme for programming the ReRAM devices in a multiplexer configured from ReRAM memory cells in accordance with the present invention. Persons of ordinary skill in the art will appreciate that other schemes are possible.

Circuit 220 includes a 4:1 multiplexer having inputs In 1 (indicated at reference numeral 222), In 2 (indicated at reference numeral 224), In 3 indicated at reference numeral (226), and In 4 (indicated at reference numeral 228). The output of the multiplexer is indicated at reference numeral 230 at the output of buffer 232.

In 1 at reference numeral 222 is connectable to the input of output buffer 232 by programming the ReRAM memory cell indicated within dashed lines 234 and including ReRAM devices 236, 238, and 240. In 2 at reference numeral 224 is connectable to the input of output buffer 232 by programming the ReRAM memory cell indicated within dashed lines 242 and including ReRAM devices 244, 246, and 248. In 3 at reference numeral 226 is connectable to the input of output buffer 232 by programming the ReRAM memory cell indicated within dashed lines 250 and including ReRAM devices 252, 254, and 256. In 4 at reference numeral 228 is connectable to the input of output buffer 232 by programming the ReRAM memory cell indicated within dashed lines 260 and including ReRAM devices 262, 264, and 266. In each case, the three ReRAM devices correspond to ReRAM devices 102, 104, and 106, respectively, shown in FIG. 3A. Similarly, the transistors (e.g., 268, 270 and 272) correspond to the second, third, and fourth programming transistors depicted in FIG. 3A with the understanding that transistor 272 is the fourth programming transistor of FIG. 3A shared amongst the four ReRAM memory cells 234, 242, 250 and 260 in FIG. 4. Transistors 296, 298, 300, and 302 correspond to the first programming transistor 110 depicted in FIG. 3A, one for each of the multiplexer inputs 222, 224, 226, and 228 depicted in FIG. 4.

In the embodiment shown in FIG. 4, the word line 286 is shared by transistors 268 and 270, the word line 288 is shared by transistors 274 and 276, the word line 290 is shared by transistors 278 and 280, and the word line 292 is shared by transistors 282 and 284. As previously noted, this is not required, but significantly simplifies the metal line layout of the integrated circuit. The word lines 304, 306, 308, and 310 for first programming transistors 296, 298, 300, and 302, respectively are shown separately, as is the MuxIn bit line 312 at the source of the common fourth programming transistor 272. From the discussions accompanying FIGS. 3A and 3B, the programming and erasing process for the ReRAM memory cells of the circuit configuration shown in FIG. 4 may be easily understood by persons of ordinary skill in the art.

Figure 5:
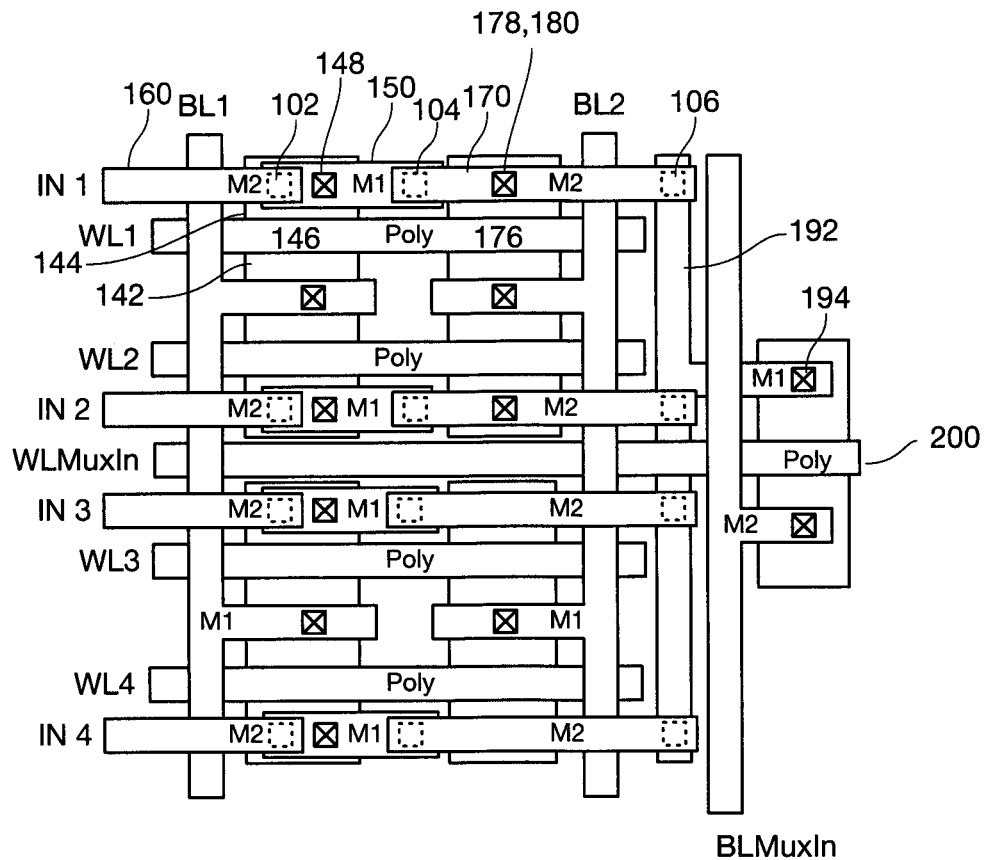
FIG. 5 is a top view of an illustrative layout of a multiplexer in accordance with one aspect of the present invention.

Referring now to FIG. 5, a top view of an illustrative layout of a multiplexer in accordance with one aspect of the present invention is shown. In order to provide an understanding of the layout shown in FIG. 5, reference numerals from the cross-sectional view of FIG. 4 have been included in FIG. 5 to show the path from the first input of the multiplexer at segment 160 of the second metal layer to the polysilicon gate 200 of the fourth programming transistor for the ReRAM cell of the first input of the multiplexer. Persons of ordinary skill in the art will appreciate that all of the features in the top view of FIG. 5 are not necessarily aligned laterally with the corresponding features of the cross sectional view of FIG. 4.

The path proceeds from segment 160 of the second metal interconnect layer through ReRAM device 102 (contacts 152 and 158 not shown) to segment 150 of the first metal interconnect layer. From there, the path proceeds to segment 170 of the second metal interconnect layer through ReRAM device 104 (contacts 162 and 168 not shown). Segment 150 of the first metal interconnect layer is shown connected to drain diffusion 144 of the second programming transistor 118 through contact 148. ReRAM device 106 is disposed between segment 170 of the second metal interconnect layer and segment 192 of the first metal interconnect layer (contacts 186 and 190 not shown). Contact 194 connects segment 192 of the first metal interconnect layer to drain diffusion 196 of the fourth programming transistor 130. Polysilicon line 200 forms the gate of the fourth programming transistor 130. The source diffusion 198 of the fourth programming transistor is shown connected through a contact to a MuxIn bitline 312 (shown in FIG. 4) formed from a segment of the second metal interconnect conductor.

Figure 6:
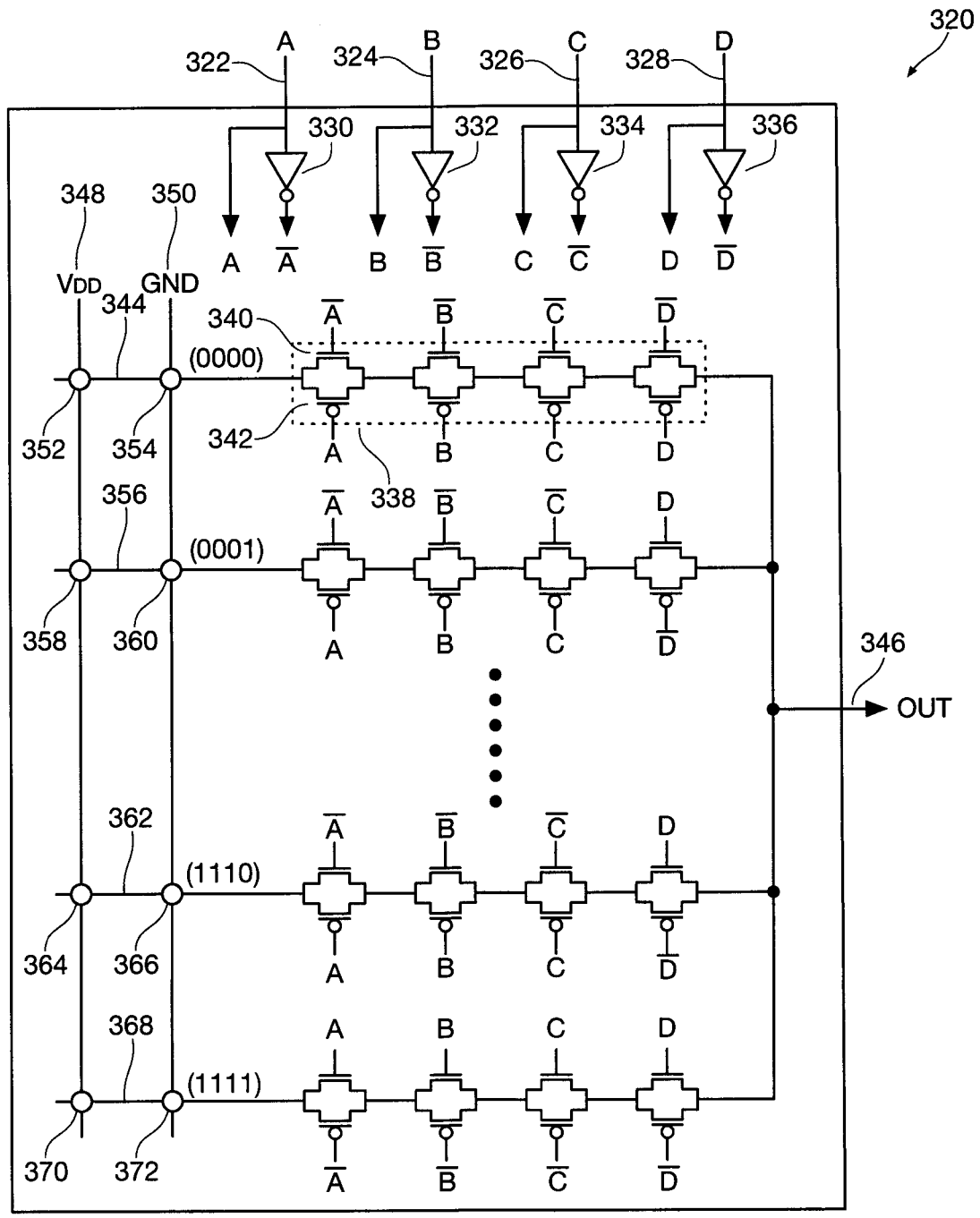
FIG. 6 is a schematic diagram showing an illustrative 4-input LUT that can be implemented using the ReRAM cells according to the present invention.

Referring now to FIG. 6, a schematic diagram shows an illustrative 4-input LUT 320 that can be implemented using the ReRAM cells according to the present invention. The LUT 320 has input A (identified by reference numeral 322), input B (identified by reference numeral 324), input C (identified by reference numeral 326), and input D (identified by reference numeral 328). Complements of inputs A, B, C, and D are generated, respectively, by inverters 330, 332, 334, and 336.

The LUT 320 is formed using sets of four CMOS passgates, the first set of which is shown inside dashed lines 338. Each passgate in each set is formed from a pair of n-channel and p-channel transistors as illustrated by n-channel transistor 340 and p-channel transistor 342 connected in parallel. Each set of four passgates can be coupled between an input line and the output of the LUT depending on the states of the four inputs A, B, C, and D.

The gates of the n channel and p-channel transistors in the passgates of each set are uniquely connected to the inputs A, B, C, and D and their complements to decode a one-of-sixteen state arrangement. The ones of the sets of CMOS passgates decoding the inputs (0000), (0001), (1110), and (1111) are shown. Thus when the states of inputs A, B, C, and D are all 0, all four passgates in only the first set 342 of passgates are turned on, connecting input line 344 to output line 346. Input line 344 is programmably connected to either $V_{DD}$ on line 348 or GND on line 350 using a ReRAM memory cell 352 or 354, respectively. From the above discussion, the operation of the other passgate sets (including the ones not shown in FIG. 6) is intuitively obvious to any person of ordinary skill in the art, e.g., by programming one of the pair of ReRAM cells 358 and 360, one of the pair of ReRAM cells 364 and 366, and one of the pair of ReRAM cells 370 and 372, either $V_{DD}$ or ground will be passed from input lines 356, 362, and 368 to output line 346 when the passgate set addressed by inputs A, B, C, and D is appropriately activated.

From an examination of FIG. 6, persons of ordinary skill in the art will appreciate that the one of ReRAM cells 352 or 354 that is not programmed will have the full $V_{DD}$ voltage across it. Because of this condition, use of the ReRAM memory cells disclosed herein is advantageous because even if one of the three ReRAM memory devices in the memory cell is stuck in its programmed state, the stress of the operating voltage VDD is shared across the other two ReRAM memory devices. This reduces the disturb voltage across each ReRAM device, thus reducing the failure rate of the ReRAM memory cells.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A resistive random-access memory cell comprising:
a first resistive random-access memory device having an ion source layer and a solid electrolyte layer;
a second resistive random-access memory device having an ion source layer and a solid electrolyte layer connected in series with the first resistive random-access memory device such that either both ion source layers or both solid electrolyte layers are adjacent to one another; and
a third resistive random-access memory device having an ion source layer and a solid electrolyte layer connected in series with the first and second resistive random-access memory devices;
wherein the first, second, and third random-access memory devices together comprise a single resistive random-access memory cell.

2. The resistive random-access memory cell of claim 1 wherein the second resistive random-access memory device is connected in series with the first resistive random-access memory device such that both ion source layers are adjacent to one another.

3. The resistive random-access memory cell of claim 1 wherein the second resistive random-access memory device is connected in series with the first resistive random-access memory device such that both solid electrolyte layers are adjacent to one another.

4. The resistive random-access memory cell of claim 1 wherein the first, second, and third ReRAM memory devices are all formed between segments of the same pair of adjacent metal interconnect layers.

5. A programmable circuit configuration in an integrated circuit comprising:
a first circuit node;
a second circuit node;
a resistive random-access memory cell connected between the first circuit node and the second circuit node, the resistive random-access memory cell including: a first resistive random-access memory device having an ion source layer and a solid electrolyte layer;
a second resistive random-access memory device having an ion source layer and a solid electrolyte layer connected in series with the first resistive random-access memory device such that either both ion source layers or both solid electrolyte layers are adjacent to one another; and
a third resistive random-access memory device having an ion source layer and a solid electrolyte layer connected in series with the first and second resistive random-access memory devices;
wherein the first, second, and third random-access memory devices together comprise a single resistive random-access memory cell.

6. The programmable circuit configuration of claim 5 wherein the second resistive random-access memory device is connected in series with the first resistive random-access memory device such that both ion source layers are adjacent to one another.

7. The programmable circuit configuration of claim 5 wherein the second resistive random-access memory device is connected in series with the first resistive random-access memory device such that both solid electrolyte layers are adjacent to one another.

8. The programmable circuit configuration of claim 5 wherein the first, second, and third resistive random-access memory devices are all formed between segments of the same pair of adjacent metal interconnect layers.

9. The programmable circuit configuration of claim 5 wherein the first circuit node is an interconnect conductor in a programmable integrated circuit.

10. The programmable circuit configuration of claim 9 wherein the second circuit node is an interconnect conductor in a programmable integrated circuit.

11. The programmable circuit configuration of claim 5 wherein:
the first circuit node is an input node of a multiplexer; and
the second circuit node is an output of the multiplexer.

12. The programmable circuit configuration of claim 5 wherein:
the first circuit node is a circuit node carrying a constant voltage representing a logic level; and the second circuit node is an addressable node of a lookup table.

13. The programmable circuit configuration of claim 5 wherein:
the first circuit node is an output node of a functional circuit in the integrated circuit; and
the second circuit node is an interconnect conductor in the integrated circuit.

14. A method for forming a programmable connection in an integrated circuit comprising:
forming a first metal interconnect layer having at least first and second segments electrically insulated from one another;
forming first and second resistive random-access memory devices over and in electrical contact with the first segment of the first metal interconnect layer, each of the first and second resistive random-access memory devices having an ion source layer and a solid electrolyte layer such that both solid electrolyte layers are adjacent to the first segment of the first metal interconnect layer;
forming a third resistive random-access memory device having an ion source layer and a solid electrolyte layer over and in electrical contact with the second segment of the first metal interconnect layer such that the solid electrolyte layer is adjacent to the second segment of the first metal interconnect layer; and
forming a second metal interconnect layer over the first and second resistive random access memory devices, the second metal interconnect layer having at least first and second segments electrically insulated from one another, the first segment of the second metal interconnect layer in electrical contact with the first resistive random access memory device such that the ion source layer of the first resistive random access memory device is adjacent to the first segment of the second metal interconnect layer, the second segment of the second metal interconnect layer in electrical contact with the second and third resistive random access memory device such that the ion source layers of the second and third resistive random access memory devices are adjacent to the second segment of the second metal interconnect layer.

15. The method of claim 14, wherein forming a first metal interconnect layer further includes forming a third segment electrically insulated from the first and second segments, the integrated circuit further comprising:
forming a first programming transistor in the integrated circuit, the first programming transistor having a drain electrically connected to the first segment of the second metal interconnect layer;
forming a second programming transistor in the integrated circuit, the second programming transistor having a drain electrically connected to the first segment of the first metal interconnect layer;
forming a third programming transistor in the integrated circuit, the second programming transistor having a drain electrically connected to the second segment of the second metal interconnect layer; and
forming a fourth programming transistor in the integrated circuit, the fourth programming transistor having a drain electrically connected to the third segment of the first metal interconnect layer.

16. The method of claim 14 further comprising:
forming a first routing interconnect conductor electrically connected to the first segment of the second metal interconnect layer; and
forming a second routing interconnect conductor electrically connected to the third segment of the first metal interconnect layer.

17. A method for forming a programmable connection in an integrated circuit comprising:
forming a first metal interconnect layer having at least first and second segments electrically insulated from one another;
forming first and second resistive random-access memory devices over and in electrical contact with the first segment of the first metal interconnect layer, each of the first and second resistive random access memory devices having an ion source layer and a solid electrolyte layer such that both ion source layers are adjacent to the first segment of the first metal interconnect layer;
forming a third resistive random-access memory device having an ion source layer and a solid electrolyte layer over and in electrical contact with the second segment of the first metal interconnect layer such that the ion source layer is adjacent to the second segment of the first metal interconnect layer; and
forming a second metal interconnect layer over the first and second resistive random access memory devices, the second metal interconnect layer having at least first and second segments electrically insulated from one another, the first segment of the second metal interconnect layer in electrical contact with the first resistive random access memory device such that the solid electrolyte layer of the first resistive random access memory device is adjacent to the first segment of the second metal interconnect layer, the second segment of the second metal interconnect layer in electrical contact with the second and third resistive random access memory device such that the solid electrolyte layers of the second and third resistive random access memory devices are adjacent to the second segment of the second metal interconnect layer.

18. The method of claim 17, wherein forming a first metal interconnect layer further includes:
forming a third segment electrically insulated from the first and second segments, the integrated circuit further comprising:
forming a first programming transistor in the integrated circuit, the first programming transistor having a drain electrically connected to the first segment of the second metal interconnect layer;
forming a second programming transistor in the integrated circuit, the second programming transistor having a drain electrically connected to the first segment of the first metal interconnect layer;
forming a third programming transistor in the integrated circuit, the second programming transistor having a drain electrically connected to the second segment of the second metal interconnect layer; and
forming a fourth programming transistor in the integrated circuit, the fourth programming transistor having a drain electrically connected to the third segment of the first metal interconnect layer.

19. The method of claim 17 further comprising:
forming a first routing interconnect conductor electrically connected to the first segment of the second metal interconnect layer; and
forming a second routing interconnect conductor electrically connected to the third segment of the first metal interconnect layer.

* * * * *